United States Patent [19]

Takada et al.

[11] Patent Number: 4,765,845
[45] Date of Patent: Aug. 23, 1988

[54] HEAT-RESISTANT THIN FILM PHOTOELECTRIC CONVERTER

[75] Inventors: Jun Takada, Kasugai; Minori Yamaguchi, Akashi; Yoshihisa Tawada, Kobe, all of Japan

[73] Assignee: Kanegafuchi Kagaku Kogyo Kabushiki Kaisha, Osaka, Japan

[21] Appl. No.: 942,644

[22] Filed: Dec. 17, 1986

Related U.S. Application Data

[63] Continuation-in-part of Ser. No. 744,602, Jun. 14, 1985, abandoned.

[30] Foreign Application Priority Data

| | | | |
|---|---|---|---|
| Jun. 15, 1984 | [JP] | Japan | 59-124331 |
| Jul. 16, 1984 | [JP] | Japan | 59-148411 |
| Oct. 11, 1984 | [JP] | Japan | 59-213943 |
| Dec. 18, 1984 | [JP] | Japan | 59-267256 |

[51] Int. Cl.[4] .......................................... H01L 31/06
[52] U.S. Cl. ................................... 136/258; 136/259; 357/30; 357/59; 357/71
[58] Field of Search ................... 136/258 AM, 258 PC, 136/259; 357/30 J, 30 K, 30 L, 30 Q, 59 C, 59 D, 71

[56] References Cited

U.S. PATENT DOCUMENTS

| | | | |
|---|---|---|---|
| 3,965,279 | 6/1976 | Levinstein et al. | 427/89 |
| 3,968,272 | 7/1976 | Anand | 427/84 |
| 4,180,596 | 12/1979 | Crowder et al. | 427/42 |
| 4,278,704 | 7/1981 | Williams | 427/75 |
| 4,532,371 | 7/1985 | Hanak et al. | 136/249 |

FOREIGN PATENT DOCUMENTS

| | | | |
|---|---|---|---|
| 92281 | 6/1983 | Japan | 136/258 AM |
| 101469 | 6/1983 | Japan | 136/258 AM |
| 209167 | 12/1983 | Japan | 136/258 AM |
| 209169 | 12/1983 | Japan | 136/258 AM |

OTHER PUBLICATIONS

Garbarino et al., Contact Barrier Metallurgy for Mosfet Gate, *IBM Technical Disclosure Bulletin*, vol. 19, No. 9, Feb. 1977, p. 3382.
Herd et al., Formation and Crystallization of Amorphous Silicides at the Interface Between Thin Metal and Amorphous Silican Films, *Thin Solid Films*, vol. 104, No. 1, (1983), pp. 197–206.
Tsai, Contact Metallurgical Process With Laser Beam Annealing, *IBM Technical Disclosure Bulletin*, vol. 25, No. 2, Jul. 1982 (pp. 601–602).

*Primary Examiner*—Aaron Weisstuch
*Attorney, Agent, or Firm*—Armstrong, Nikaido, Marmelstein & Kubovcik

[57] ABSTRACT

A heat-resistant thin film photoelectric converter, comprising a semiconductor layer, a front transparent electrode, a rear metal electrode, and a diffusion-blocking layer, said diffusion-blocking layer being provided between the semiconductor layer and the rear metal electrode and being a layer of metal silicide having a thickness of 5 Å to 200 Å.

The converter of the present invention can avoid the reduction in the efficiency due to the diffusion of metal or metallic compound from the electrode into the semiconductor.

11 Claims, 1 Drawing Sheet hν hν

HEAT-RESISTANT THIN FILM PHOTOELECTRIC CONVERTER

CROSS-REFERENCE TO RELATED APPLICATION

This is a continuation-in-part of application Ser. No. 744,602 filed on June 14, 1985 and now abandoned.

BACKGROUND OF THE INVENTION

The present invention relates to a heat-resistant thin film photoelectric converter.

Thin film photoelectric converters are used as solar cells, photo-detectors, photo-receptors for electrophotography, lasers, electro-luminescent devices, and the like. A thin film photoelectric converter contains fundamentally a layer of semiconductor and electrodes which come in contact with the layer of semiconductor. As electrodes, a transparent electrode and/or a metal electrode are used. As a material for the transparent electrode, there hitherto has been used a metallic compound such as ITO, $ITO/SnO_2$, $SnO_2$, $In_2O_3$, $Cd_xSnO_y$ ($x=0.5$ to 2, $y=2$ to 4), $Ir_zO_{1-z}$ ($z=0.33$ to 0.5), or the like. As a metal electrode, a metal such as Al, stainless steel, Fe, Ni, Cu, brass, Zn, Ag, or the like is provided on the semiconductor.

In FIG. 2, as an example of a photoelectric converter, a typical structure of a solar cell is illustrated. A solar cell has, as shown in FIG. 2, a transparent electrode 2 of a metallic compound (e.g. a metal oxide) on a transparent substrate 1 (e.g. a glass), and thereon, a layer of p-type semiconductor 3, a layer of i-type semiconductor 4, and a layer of n-type semiconductor 5 are provided. On the layer of n-type semiconductor 5, a metal electrode layer 6 is provided as a rear electrode. Light enters the semiconductor layer through a transparent electrode and is absorbed therein so as to generate electric power. A part of the light which is not absorbed in the semiconductor layer reaches the rear electrode and is reflected back to be absorbed in the semiconductor layer.

When a conventional solar cell is used at a temperature above about 50° C., a metal such as Al, Cu, brass, zinc or Ag, or metallic compound in the electrode is diffused into the semiconductor layer, so that the efficiency of the semiconductor is lowered. Especially, when an amorphous or microcrystalline semiconductor is used, the efficiency of the amorphous or microcrystalline semiconductor is notably lowered. For instance, in the case where the solar cell is used in the open air, the temperature at the surface of the solar cell reaches about 80° C., so that the efficiency is remarkably lowered.

There are some metals which are not diffused into the semiconductor layer when they are used as an electrode. Examples of such metals are Cr, Ni, Fe, or stainless steel. However, those metals have the low electric conductivity or a low reflectivity compared with the above-mentioned metals such as Al, Cu, brass, Zn, and Ag. Thus, a solar cell having an electrode of Cr, Ni, Fe or stainless steel has a drawback due to ohmic loss in the electrode or reflection loss of light at the electrode. Any type of photoelectric converter, not only a solar cell, has the disadvantage as mentioned above when used at a high temperature.

An object of the present invention is to provide a heat-resistant thin film photoelectric converter, in order to avoid the reduction in the efficiency owing to the diffusion of metal or metallic compound from the electrode into the semiconductor layer, under the condition that the ohmic loss in the rear electrode and the reflection loss of light at the rear electrode are not increased.

SUMMARY OF THE INVENTION

The present invention relates to a heat-resistant thin film photoelectric converter which comprises a thin film semiconductor, a front transparent electrode, a rear metal electrode, and a diffusion-blocking layer. The diffusion-blocking layer is provided between the semiconductor and the rear metal electrode. The diffusion-blocking layer is a layer of metal silicide having a thickness of 5 Å to 200 Å.

DETAILED DESCRIPTION

Figure 1:
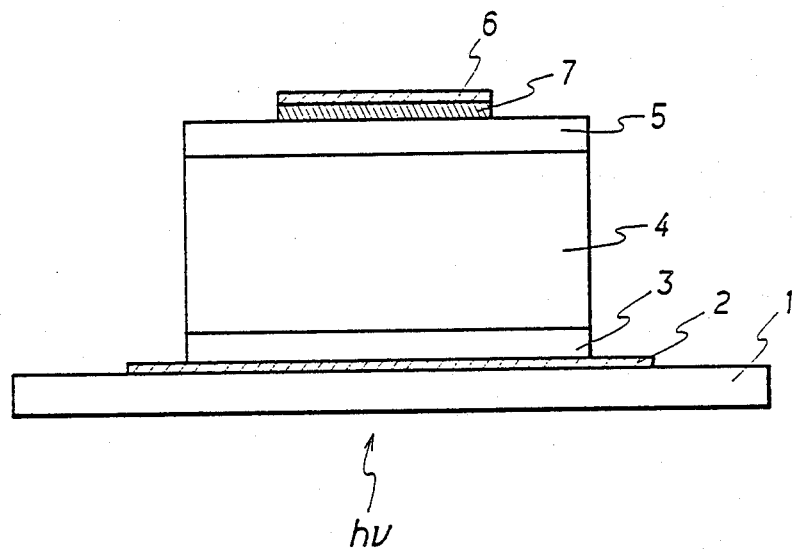
FIG. 1 is a schematic view of a thin film photoelectric converter according to the present invention.
Figure 2:
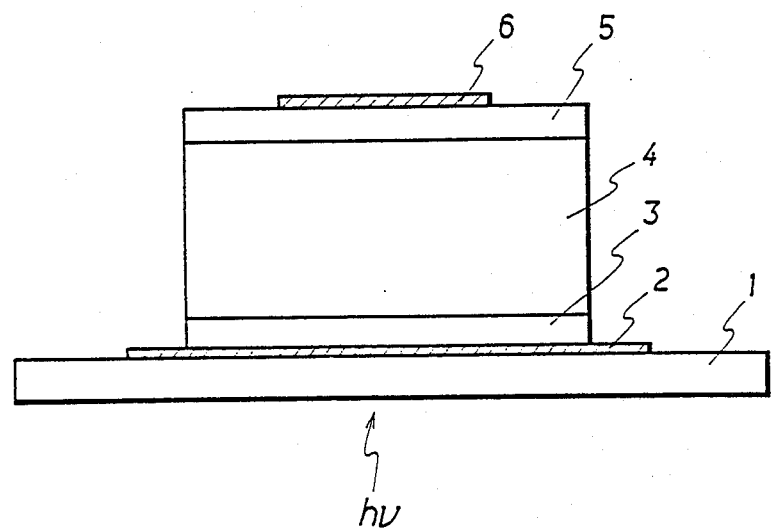
FIG. 2 is a schematic view of a conventional thin film photoelectric converter.

In a heat-resistant thin film photoelectric converter of the present invention, a diffusion-blocking layer is provided between the semiconductor layer and the rear electrode layer. In FIG. 1, the diffusion-blocking layer 7 is provided between the rear electrode 6 and n-type semiconductor layer 3.

Such a diffusion-blocking layer prevents diffusion of metal or metallic comopound used as the rear elctorde into a layer of semiconductor. The component of the diffusion-blocking layer is a metal silicide.

Examples of metal silicides used for a diffusion-blocking layer are silicides of metals of the Groups IA, IIA (excepting Be), IIIB, IVB, VB, VIB, VIIB (excepting Tc) and VIII of the Periodic Table. Specific examples of metal silicides are strontium silicide, barium silicide, titanium silicide, zirconium silicide, hafnium silicide, vanadium silicide, niobium silicide, tantalum silicide, chromium silicide, molybdenum silicide, tungsten silicide, manganese silicide, rhenium silicide, iron silicide, ruthenium silicide, osmium silicide, cobalt silicide, iridium silicide, nickel silicide, and platinum silicide. Among those silicides, a silicide of Group VIB metal of the Periodic Table or a silicide of metal alloy containing more than 50 atomic % of Group VIB metal is preferable, since the material is not costly and the layer is easily formed on the semiconductor. Especially, chromium silicide or a silicide of a metal alloy containing more than 50 atomic % of chromium is preferable. The content of metal in the metal silicide is 1 atomic % to 90 atomic %, preferably 1 atomic % to 50 atomic %. When the content of metal is less than 1 atomic %, the thermal diffusion of the metal or the metal compound of the electrode cannot be prevented. When the content of metal is over 90 atomic %, the transparency of the layer becomes poor, so that the impinging light or the reflected light from the rear electrode cannot be fully utilized. The absorption coefficient of the metal silicide is preferably $10^6$ cm$^{-1}$ to $10^4$ cm$^{-1}$ for wavelengths of 400 nm to 700 nm.

In the present invention, the thickness of the diffusion-blocking layer is 5 Å to 200 Å, preferably 5 Å to 150 Å, more preferably 7 Å to 100 Å.

When the thickness is below 5 Å, a uniform and homogeneous layer cannot be obtained and the diffusion of the metal of the electrode to the semiconductor cannot be fully prevented. When the thickness is above 200 Å, the series electric resistance of the layer is increased, reflectivity at the rear electrode is decreased, and too much time for depositing the layer is required.

The thickness of the diffusion-blocking layer can be measured by using a crystal sensor, or determined from surface analysis by means of SIMS (Secondary Ion Mass Spectroscopy).

The semiconductor in the invention is preferably an amorphous or microcrystalline semiconductor, because the reduction in the characteristics of amorphous or microcrystalline semiconductors at high temperatures is remarkably improved.

Semiconductor layers of a thickness of 0.02 to 100 μm can be used in the present invention.

With respect to the composition of the semiconductor, silicon or silicon alloys containing hydrogen, fluorine, carbon, nitrogen, oxygen, germanium, or tin are preferably used. Specific examples of such semiconductors are as follows: a-Si:H, a-Si:F:H, a-SiGE:H, a-SiSn:H, a-SiN:H, a-SiGE:F:H, a-SiSn:F:H, a-Si:N:F:H, a-SiC:H, a-SiC:F:H, a-SiO:H, a-SiO:F:H, μc-Si:H, and μc-Si:F:H, wherein, a- indicates amorphous and μc- indicates microcrystalline.

In the present invention, a junction structure of p-i-n, p-n or Schottky type can be used. For the semiconductor layer which contacts the diffusion-blocking layer, n-type is preferable because the improvement of the characteristics in the invention is notable.

The electrode is placed on the incident side (transparent side) of light and/or the other side (back side).

The electrode on the incident side of light is transparent and is made of a metallic compound such as ITO (film of $In_2O_3$ containing $SnO_2$), $ITO/SnO_2$, $SnO_2$, $In_2O_3$, $Cd_xSnO_y$ (x=0.5 to 2, y=2 to 4), $Ir_zO_{1-z}$ (z=0.33 to 0.5), or the like, but other materials can be used.

The electrode provided on the back side is a rear electrode made of metal or an alloy of metals. Any metal or alloy is usable insofar as it is usually used as a material of a rear electrode. For instance, Al, Ag, Au, Cu, brass, Zn, or the like is normally used as a rear electrode. Any metal or alloy having the same physicochemical properties can be used in the invention. However, a material which forms a silicide, such as Li, Na, Ka, Rb, Cs, Mg, Ca, Sr, Ba, Sc, Y, la; Ti, Zr, Hf, V, Nb, Ta, Cr, Mo, W, Mn, Re, Fe, Ru, Os, Co, Rh, Ir, Ni, Pd, and Pt is less suitable as a material of the electrode since such a metal has a low electric conductivity and/or low reflectivity. Moreover, the thickness of the diffusion-blocking layer cannot be precisely controlled due to the formation of silicide by the reaction of the metal of the electrode and the silicon in the semiconductor.

As a rear electrode, a metal having an electric conductivity of $0.1 \times 10^5$ to $6.2 \times 10^5 \Omega^{-1} cm^{-1}$ can be used. The electric conductivity is preferably above $1.5 \times 10^5 \Omega^{-1} cm^{-1}$, and especially, above $3.0 \times 10^5 \Omega^{-1} cm^{-1}$ because the ohmic loss in the electrode is then very small.

Another factor in selecting a material for a rear electrode is its reflectivity of light. A metal having a reflectivity more than 20% to 99% for a light of wavelength of about 700 nm can be used. A metal having a reflectivity of more than 50% to 99% for light of wavelength of about 700 nm is preferable. Examples of such metal are Ag, Au, Al or Cu. Reflectivity in the present invention is defined as reflectivity at the interface between a layer of hydrogenated amorphous silicon (a-Si:H) and an electrode. The reflectivity $R_{max}$ is given in the following formula:

$$R_{max} = \frac{(n_1 - n_2)^2 + k_2^2}{(n_1 + n_2)^2 + k_2^2}$$

wherein, $n_1$ is the real part of the complex reflective index of hydrogenated amorphous silicon (a-Si:H), and $n_2$ and $k_2$ are the real and imaginary parts of a complex reflective index of the metal, respectively.

Metals which satisfy the above condition are Ag, Au, Al, Cu, and Zn. Among those metals, Ag, Au, Al, and Cu are preferable for the rear electrode.

Besides, both monolayer and multilayer types of rear electrode can be used. In the multilayer type, the layer which directly contacts with the diffusion-blocking layer in the invention should possess high reflectivity and high conductivity so that the light is fully reflected at the contact surface and the series resistance of the interface is not increased.

The preparation of a heat-resistant thin film photoelectric converter in the present invention is explained as follows:

The semiconductor is assumed, for example, to be a p-i-n type semiconductor as is used for solar cells. The surface of the p-type semiconductor faces a light-incident window. The entire thickness of the semiconductor of the photoelectric converter in the invention is 0.02 μm to 100 μm.

In the present invention, not only the p-i-n type semiconductor junction as mentioned above, but also Schottky type or p-n type semiconductor junctions can be used. For solar cells, either hetero-junction or homo-junction types can be used.

The amorphous p-i-n type semiconductor film is deposited on a transparent electrode which is provided on a transparent substrate. The p-layer contacts the transparent electrode.

The diffusion-blocking layer in the invention is deposited by means of electron-beam-evaporation onto the amorphous p-i-n semiconductor film. Alternatively, the sputtering method can also be employed.

The material to be deposited on the semiconductor is a metal silicide.

The layer of metal silicide is formed by depositing the metal silicide compound by means of electron-beam-evaporation or sputtering. However, another method can also be employed wherein a metal is deposited by sputtering and simultaneously silicon is deposited by glow-discharge decomposition. A co-sputtering process can also be employed for the deposition of the layer, wherein sputtering of metal and sputtering of silicon are carried out simultaneously.

The preparation of metal silicide is also performed by depositing only silicide-formable metal on the semiconductor layer, and then annealing the deposited layer for 0.5 to 4 hours at 80° C. to 400° C. A reaction of the metal with silicon in the semiconductor takes place to form metal silicide. If necessary, the residual metal layer is etched. In the method, a metal silicide layer of 5 Å to 200 Å thickness is obtained. The content of the metal in the layer is 2 atomic % to 20 atomic %. The annealing method for preparing metal silicide is preferable since it is easy to fabricate the converter.

After depositing the diffusion-blocking layer of the invention, a rear electrode is deposited on the layer.

The heat-resistant thin film photoelectric converter prepared by the above-described process has the advantage that its conversion efficiency is not lowered by heating. Besides, by annealing the converter at a temperature of 80° C. to 400° C. for 0.5 to 4 hours, the diffusion-blocking layer comes into closer contact with the semiconductor and the electrode, so that the series resistance at the interface decreases.

The heat-resistant thin film photoelectric converter of the present invention can be preferably utilized as a solar cell or photo-detector, since the ambient temperature of solar cells and photo-detectors often becomes more than 50° C. Especially, with respect to solar cells, the ambient temperature reaches about 80° C. in the open air, so that the advantage of the photoelectric detector of the present invention is emphasized.

In addition, another advantage of the invention is that the reflection loss at the rear electrode for the longer wavelengths of light is very small because the diffusion-blocking layer is comparatively thin, that is, 5 Å to 200 Å thick. So, the conversion efficiency can be raised.

A heat-resistant thin film photoelectric converter of the present invention and its preparation are exemplified by the following Examples.

It is to be understood that the present invention is not limited to the Examples, and various changes and modifications may be made in the invention without departing from the spirit and scope thereof.

EXAMPLE 1

On a glass substrate of 1 mm thick, a transparent ITO/$SnO_2$ electrode of 1,000 Å was provided.

The amorphous p-layer of 120 Å, i-layer of 5,000 Å, and n-layer of 500 Å were successively deposited by means of glow-discharge decomposition. In the depositing process for the p-type semiconductor, a mixed gas composed of $SiH_4$ and $B_2H_6$ was used at a temperature of 200° C. of the substrate and under a pressure of about .1 Torr. A mixed gas of $SiH_4$ and $H_2$, and a mixed gas of $SiH_4$ and $PH_3$ were used for depositing the i-type and n-type semiconductors, respectively. The depositing conditions were the same as the conditions for depositing the p-type semiconductor.

Then chromium was deposited by means of electron-beam-evaporation under a pressure of $10^{-6}$ Torr onto the n-layer of the semiconductor. The thickness of the chromium layer was 100 Å. Aluminum was deposited thereon in 1000 Å thick layer, and thereafter the solar cell was annealed for 1.5 hours at 150° C.

The characteristics of the solar cell formed by the above-described process were measured by a solar simulator under a condition of AM-1, 100 mW/$cm^2$. The characteristics were again measured after heating the cell at 230° C. for 2 hours. The results are shown in Table 1.

EXAMPLE 2

A solar cell was prepared in the same manner as in Example 1 but it was not annealed. The characteristics were measured, and after heating the cell at 230° C. for 2 hours, the characteristics were again measured. The result is shown in Table 1.

EXAMPLE 3

In the same manner as in Example 1, chromium was deposited in a 100 Å thick layer and annealed at 210° C. for 2 hours. Thereafter the residual chromium was etched and then the aluminum was deposited to a thickness of 1000 Å. The solar cell was again annealed at 200° C. for 2 hours. The Cr-Si layer of 100 Å included 10 atomic % of chromium.

The solar cell was heated for 2 hours at 230° C. Before and after heating, the solar cell was measured as in Example 1, respectively. The results are shown in Table 1.

EXAMPLE 4

A solar cell was prepared in the same manner as in Example 3 except that it was not annealed at 200° C. for 2 hours. The obtained solar cell was measured before and after heating at 230° C. for 2 hours. The results are shown in Table 1.

EXAMPLE 5

A solar cell was prepared in the same manner as in Example 3 except that the thickness of the n-layer was 300 Å and the chromium was deposited in a thickness of 20 Å and silver was deposited thereon in 1000 Å as a rear electrode. The obtained solar cell was annealed at 200° C. for 2 hours. The results before and after heating at 230° C. for 6 hours are shown in Table 1.

EXAMPLE 6

A solar cell was prepared in the same manner as in Example 5, but it was not annealed at 200° C. for 2 hours. The characteristics of the obtained solar cell were measured. The results are shown in Table 1.

COMPARATIVE EXAMPLE 1

A solar cell was prepared in the same manner as in Example 1 but the diffusion-blocking layer was not provided. The characteristics before and after heating at 230° C. for 2 hours were measured in the same manner as in Example 1. The results are shown in Table 1.

COMPARATIVE EXAMPLE 2

A solar cell was prepared in the same manner as in Example 5 except that the diffusion-blocking layer was not provided. The characteristics before and after heating at 230° C. for 6 hours were measured in the same manner as in Example 5. The results are shown in Table 1.

COMPARATIVE EXAMPLE 3

A solar cell wherein the aluminum back electrode was replaced by a chromium back electrode was prepared as in Comparative Example 1.

The characteristics before and after heating at 230° C. for 2 hours are shown in Table 1.

TABLE 1

| | Characteristics of solar cell before heating | | | | Characteristics of solar cell after heating | | | | Heating condition | |
|---|---|---|---|---|---|---|---|---|---|---|
| | Short circuit current density Jsc | Open circuit Voltage Voc | Fill factor FF | Conversion efficiency $\eta$ | Jsc | Voc | FF | $\eta$ | °C. | hours |
| Ex. 1 | 0.98 | 0.98 | 0.99 | 0.95 | 0.89 | 0.98 | 0.99 | 0.79 | 230 | 2 |
| Ex. 2 | 0.96 | 0.96 | 0.90 | 0.83 | 0.82 | 0.98 | 0.99 | 0.80 | 230 | 2 |
| Ex. 3 | 1.00 | 1.00 | 1.00 | 1.00 | 0.91 | 1.00 | 1.00 | 0.91 | 230 | 2 |

TABLE 1-continued

| | Characteristics of solar cell before heating | | | | Characteristics of solar cell after heating | | | | | |
| --- | --- | --- | --- | --- | --- | --- | --- | --- | --- | --- |
| | Short circuit current density | Open circuit Voltage | Fill factor | Conversion efficiency | | | | | Heating condition | |
| | Jsc | Voc | FF | η | Jsc | Voc | FF | η | °C. | hours |
| Ex. 4 | 0.96 | 0.96 | 0.90 | 0.83 | 0.82 | 0.98 | 0.99 | 0.80 | 230 | 2 |
| Com Ex. 1 | 1.00 | 1.00 | 1.00 | 1.00 | 0.48 | 0.30 | 0.64 | 0.09 | 230 | 2 |
| Com Ex. 3 | 0.85 | 0.98 | 0.93 | 0.77 | 0.72 | 0.98 | 0.93 | 0.66 | 230 | 2 |
| Ex. 5 | 1.00 | 1.00 | 1.00 | 1.00 | 0.97 | 1.00 | 1.00 | 0.97 | 230 | 6 |
| Ex. 6 | 0.79 | 0.96 | 0.90 | 0.68 | — | — | — | — | — | — |
| Com Ex. 2 | 1.00 | 1.00 | 1.00 | 1.00 | 0.67 | 0.97 | 0.64 | 0.42 | 230 | 6 |

(Note) Values of Examples 1 to 4 and Comparative Example 3 are relative to the values regarded as 1.00 for solar cell before heating in Comparative Example 1. Values of Examples 5 and 6 are relative to the values regarded as 1.00 for solar cell before heating in Comparative Example 2.

What we claim is:

1. A heat-resistant thin film photoelectric converter, comprising a semiconductor layer, a front transparent electrode, a rear metal electrode, and a diffusion-blocking layer, said diffusion-blocking layer being provided between the semiconductor layer and the rear metal electrode and being a layer of metal silicide having a thickness in the range of 5 Å to 200 Å.

2. The converter of claim 1, wherein the thickness of the diffusion-blocking layer of metal silicide is 5 Å to 150 Å.

3. The converter of claim 1, wherein the thickness of the diffusion-blocking layer of metal silicide is 7 Å to 100 Å.

4. The converter of claim 1, wherein the silicide contains 1 atomic % to 90 atomic % of metal.

5. The converter of claim 1, wherein the absorption coefficient of said metal silicide layer in the wavelength range of 400 nm to 700 nm is $10^6$ to $10^4$ cm$^{-1}$.

6. The converter of claim 1, wherein the metal of the metal silicide is a metal of the Group VIB of the Periodic Table.

7. The converter of claim 1, wherein the metal silicide is chromium silicide.

8. The converter of claim 1, wherein the semiconductor is at least one member selected from the group consisting of amorphous and microcrystalline semiconductor.

9. The converter of claim 8, wherein the semiconductor is an alloy of silicon and at least one member selected from the group consisting of H, F, N, C, O, Ge, and Sn.

10. The converter of claim 1, wherein the metal of said rear metal electrode has a conductivity of $0.1 \times 10^5$ to $6.2 \times 10^5 \Omega^{-1}$ cm$^{-1}$ and reflectivity of 20% to 99% at 700 nm.

11. The converter of claim 10, wherein the metal of said rear metal electrode has a conductivity of $3.0 \times 10^5$ to $6.2 \times 10^5 \Omega^{-1}$ cm$^{-1}$ and reflectivity of 50 to 99% at 700 nm.

* * * * *